(12) United States Patent
Beix et al.

(10) Patent No.: US 11,362,137 B2
(45) Date of Patent: Jun. 14, 2022

(54) OPTOELECTRONIC DEVICE COMPRISING A MATRIX OF THREE-DIMENSIONAL DIODES

(71) Applicant: Aledia, Grenoble (FR)

(72) Inventors: Vincent Beix, Fontaine (FR); Erwan Dornel, Champagnier (FR)

(73) Assignee: Aledia, Grenoble (FR)

( * ) Notice: Subject to any disclaimer, the term of this patent is extended or adjusted under 35 U.S.C. 154(b) by 41 days.

(21) Appl. No.: 16/958,628

(22) PCT Filed: Dec. 21, 2018

(86) PCT No.: PCT/FR2018/053513
§ 371 (c)(1),
(2) Date: Jun. 26, 2020

(87) PCT Pub. No.: WO2019/129978
PCT Pub. Date: Jul. 4, 2019

(65) Prior Publication Data
US 2020/0335548 A1 Oct. 22, 2020

(30) Foreign Application Priority Data
Dec. 27, 2017 (FR) ...................................... 1763244

(51) Int. Cl.
*H01L 27/15* (2006.01)
(52) U.S. Cl.
CPC .................................. *H01L 27/156* (2013.01)
(58) Field of Classification Search
CPC ........ H01L 27/156; H01L 33/18; H01L 33/42
See application file for complete search history.

(56) References Cited

U.S. PATENT DOCUMENTS

| 4,868,614 A | 9/1989 | Yamazaki |
| 9,608,037 B2 | 3/2017 | Bono et al. |

(Continued)

FOREIGN PATENT DOCUMENTS

| EP | 2960940 B1 | 3/2017 |
| FR | 3053054 A1 | 12/2017 |

(Continued)

OTHER PUBLICATIONS

International Search Report for International Application No. PCT/FR2018/053513, dated Apr. 11, 2019, 8 pages (including English translation).

(Continued)

*Primary Examiner* — Changhyun Yi
(74) *Attorney, Agent, or Firm* — TraskBritt

(57) ABSTRACT

The disclosure relates to an optoelectronic device comprising: a plurality of separate first electrodes that extend longitudinally in parallel to an axis A1, each first electrode being formed of a longitudinal conductive portion and a conductive nucleation strip, the longitudinal conductive portion having an electrical resistance lower than that of the conductive nucleation strip; a plurality of diodes; at least one intermediate insulating layer covering the first electrodes; and a plurality of separate second electrodes in the form of transparent conductive strips that extend longitudinally in contact with second doped portions, and are electrically insulated from the first electrodes by means of the intermediate insulating layer, parallel to an axis A2, the axis A2 not being parallel to axis A1.

12 Claims, 9 Drawing Sheets

(56) References Cited

U.S. PATENT DOCUMENTS

| | | |
|---|---|---|
| 9,954,141 B2 | 4/2018 | Pourquier et al. |
| 2013/0256689 A1* | 10/2013 | Pougeoise ....... H01L 31/035227 257/76 |
| 2015/0279903 A1* | 10/2015 | Mandi ................. H01L 33/0062 257/88 |
| 2015/0280053 A1 | 10/2015 | Gilet et al. |

FOREIGN PATENT DOCUMENTS

| | | |
|---|---|---|
| WO | 2012/136665 A1 | 10/2012 |
| WO | 2016/108023 A1 | 7/2016 |
| WO | 2017/042512 A1 | 3/2017 |
| WO | 2018/002498 A1 | 1/2018 |

OTHER PUBLICATIONS

International Written Opinion for International Application No. PCT/FR2018/053513, dated Apr. 11, 2019, 14 pages (including English translation).

* cited by examiner

OPTOELECTRONIC DEVICE COMPRISING A MATRIX OF THREE-DIMENSIONAL DIODES

CROSS-REFERENCE TO RELATED APPLICATIONS

This application is a national phase entry under 35 U.S.C. § 371 of International Patent Application PCT/FR2018/053513, filed Dec. 21, 2018, designating the United States of America and published in French as International Patent Publication WO 2019/129978 A1 on Jul. 4, 2019, which claims the benefit under Article 8 of the Patent Cooperation Treaty to French Patent Application Serial No. 1763244, filed Dec. 27, 2017.

TECHNICAL FIELD

The field of this disclosure is that of optoelectronic devices with a matrix of three-dimensional diodes, for example, of the wire or pyramidal type. The disclosure applies to the field of devices with a matrix of light-emitting diodes such as lighting devices, display screens and image projectors, as well as to the field of devices with a matrix of photodiodes such as photodetectors and sensors.

BACKGROUND

There exist optoelectronic devices with a matrix of light-emitting diodes suitable for forming lighting devices, display screens and image projectors. Document EP2960940 illustrates an example of an optoelectronic device with a matrix of light-emitting diodes. As illustrated schematically in FIG. 1, this optoelectronic device A1 comprises a plurality of light-emitting diodes A2 each comprising a stack of a p-doped portion A6 and of an n-doped portion A4 separated from one another by an active region A5 from which the light radiation from the diode A2 is mainly generated.

The light-emitting diodes A2 have what is called a mesa structure, i.e., they are obtained from a stack of semiconductor layers intended to form the doped portions A4, A6 and the active area A5, a localized etch being carried out so as to separate the light-emitting diodes A2 from one another. Each diode A2 is in the shape of an L, the flanks of which are coated with an insulating layer, except at the site of a step A3 formed by the doped portion A4. First electrodes A8 rest on the upper surface of the doped portions A6 and second electrodes A7 extend between the diodes A2 and come into contact with the steps A3 formed by the doped portions A4. A display pixel then comprises the stack of the doped portions A4, A6, of the active region A5 and of the first electrode A8, as well as the second electrode A7 adjacent to the stack. A connection structure is joined to the upper face of the matrix of light-emitting diodes and is intended to be hybridized with an integrated control circuit.

However, this optoelectronic device has the drawback of requiring a step of etching the doped semiconductor layers and the active layer in order to separate the diodes. Now, this etching step may result in the formation of structural defects that are liable to negatively affect the optical and/or electronic properties of the diodes. In addition, the ratio of the emissive area of each diode to the area of each pixel is decreased by the need to form a step in the n-doped portion and by the presence of the second electrode that extends between the diodes so as to come into contact with this step. This, therefore, decreases the maximum light intensity with respect to each pixel.

BRIEF SUMMARY

One object of the disclosure is to overcome the drawbacks of the prior art, at least in part, and more particularly to provide an optoelectronic device with a matrix of three-dimensional diodes forming pixels that can be activated independently of one another. Another object is to propose an optoelectronic device in which the electrical conduction of the charge carriers in first electrodes electrically connected to the bases of the three-dimensional diodes is improved.

To this end, the subject of the disclosure is an optoelectronic device comprising:
  a carrier;
  a plurality of separate first electrodes that extend longitudinally in contact with the carrier, parallel to an axis A1, each first electrode being formed of a stack of a longitudinal conductive portion located in contact with the carrier and coated with a conductive nucleation strip, the longitudinal conductive portion having an electrical resistance lower than that of the conductive nucleation strip;
  a plurality of diodes each comprising a first three-dimensional portion doped according to a first conductivity type and a second portion doped according to a second conductivity type opposite the first type, the first doped portions being in contact with the conductive nucleation strips, and being arranged such that each conductive nucleation strip is in contact with a plurality of first doped portions arranged longitudinally;
  at least one intermediate insulating layer covering the first electrodes; and
  a plurality of separate second electrodes in the form of transparent conductive strips that extend longitudinally in contact with the second doped portions, and are electrically insulated from the first electrodes by means of the intermediate insulating layer, parallel to an axis A2, the axis A2 not being parallel to the axis A1, such that one and the same transparent conductive strip is in contact with second doped portions of a set of diodes, the first doped portions of which are in contact with different conductive nucleation strips.

Some preferred but non-limiting aspects of this optoelectronic device are as follows.

The longitudinal conductive portions may have a predetermined thickness and be made of a semiconductor material doped according to the first conductivity type, the doping level and the thickness being adjusted such that an electrical resistivity to thickness ratio of the longitudinal conductive portions is lower than that of the conductive nucleation strips.

The first electrodes may be isolated transversely from one another by trench isolations.

Each first electrode may rest on a lower insulating layer and have lateral flanks that extend down to the lower insulating layer, the intermediate insulating layer extending so as to cover the conductive nucleation strips and the lateral flanks.

The transparent conductive strips may extend so as to cover the conductive nucleation strips, the lateral flanks and the lower insulating layer, and be electrically insulated from the lateral flanks by the intermediate insulating layer.

Each trench isolation may be filled with an insulating material forming, together with the conductive nucleation strips, a planar surface.

The trench isolations may have a width of between 0.15 µm and 10 µm.

The carrier may comprise a semiconductor layer doped according to the second conductivity type, the longitudinal conductive portions being formed in the doped semiconductor layer in the form of longitudinal wells separate from one another and doped according to the first conductivity type.

The intermediate insulating layer may extend planarly and covers the first electrodes while being in contact with the conductive nucleation strips.

Each transparent conductive strip may comprise parts covering a set of second doped portions, the covering parts being connected to one another by connecting parts resting on the intermediate insulating layer.

The connecting parts may be covered by and in contact with a reflective conductive layer.

The material of the conductive nucleation strips may comprise a transition metal.

BRIEF DESCRIPTION OF THE DRAWINGS

Other aspects, aims, advantages and features of the disclosure will become more apparent on reading the following detailed description of preferred embodiments thereof, provided by way of non-limiting example and with reference to the appended drawings, in which.

DETAILED DESCRIPTION

In the figures and in the following description, the same references represent identical or similar elements. In addition, the various elements are not shown to scale so as to enhance the clarity of the figures. Furthermore, the various embodiments and variants are not mutually exclusive and may be combined with one another. Unless otherwise indicated, the terms "substantially," "approximately" and "about" mean to within 10%. Furthermore, the expression "comprising a/an" should be understood as "comprising at least one," unless otherwise indicated.

The disclosure relates to an optoelectronic device comprising a matrix of pixelized three-dimensional diodes, i.e., the diodes are arranged in different pixels that can be activated independently of one another. The shape of the diodes is three-dimensional and each has a first three-dimensional doped portion and a second doped portion. The three-dimensional shape of the diodes may be such that the diodes take the shape of wires, studs, pyramids or the like. The diodes may be light-emitting diodes suitable for emitting light radiation, or photodiodes suitable for receiving light radiation. Thus, the pixels may be light pixels or photodetection pixels. In the following description, the diodes are light-emitting diodes.

Figure 1:
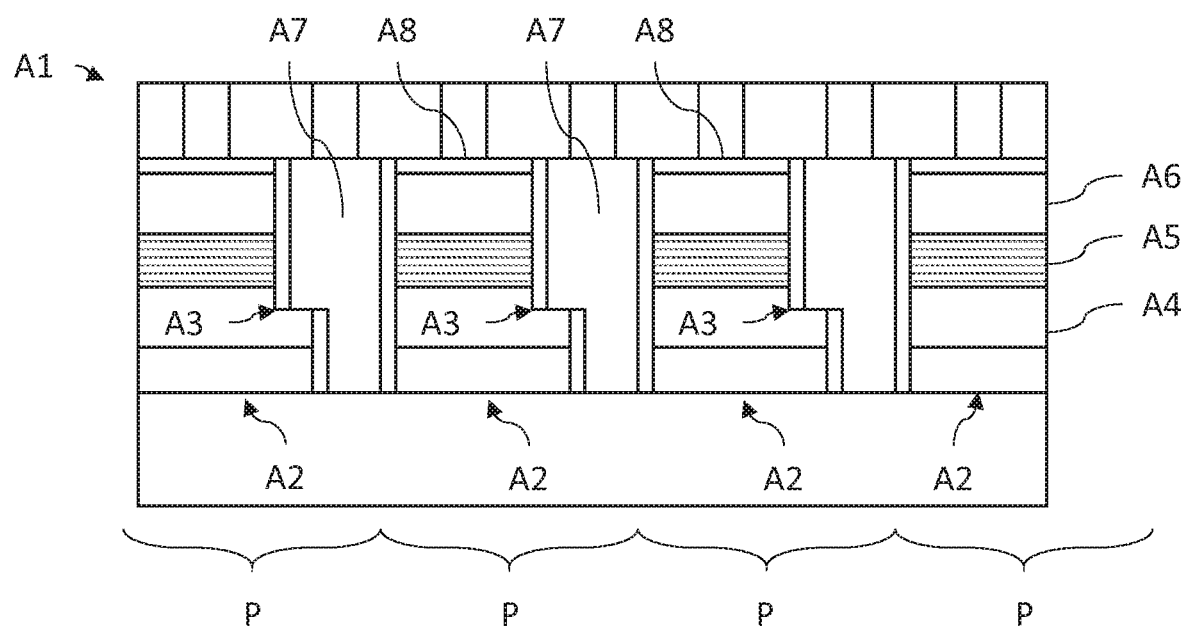
FIG. 1, already described, is a schematic and partial sectional view of an example of an optoelectronic device with a matrix of light pixels comprising light-emitting diodes of the mesa type.
Figure 1:
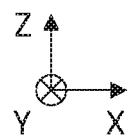
Figure 2:
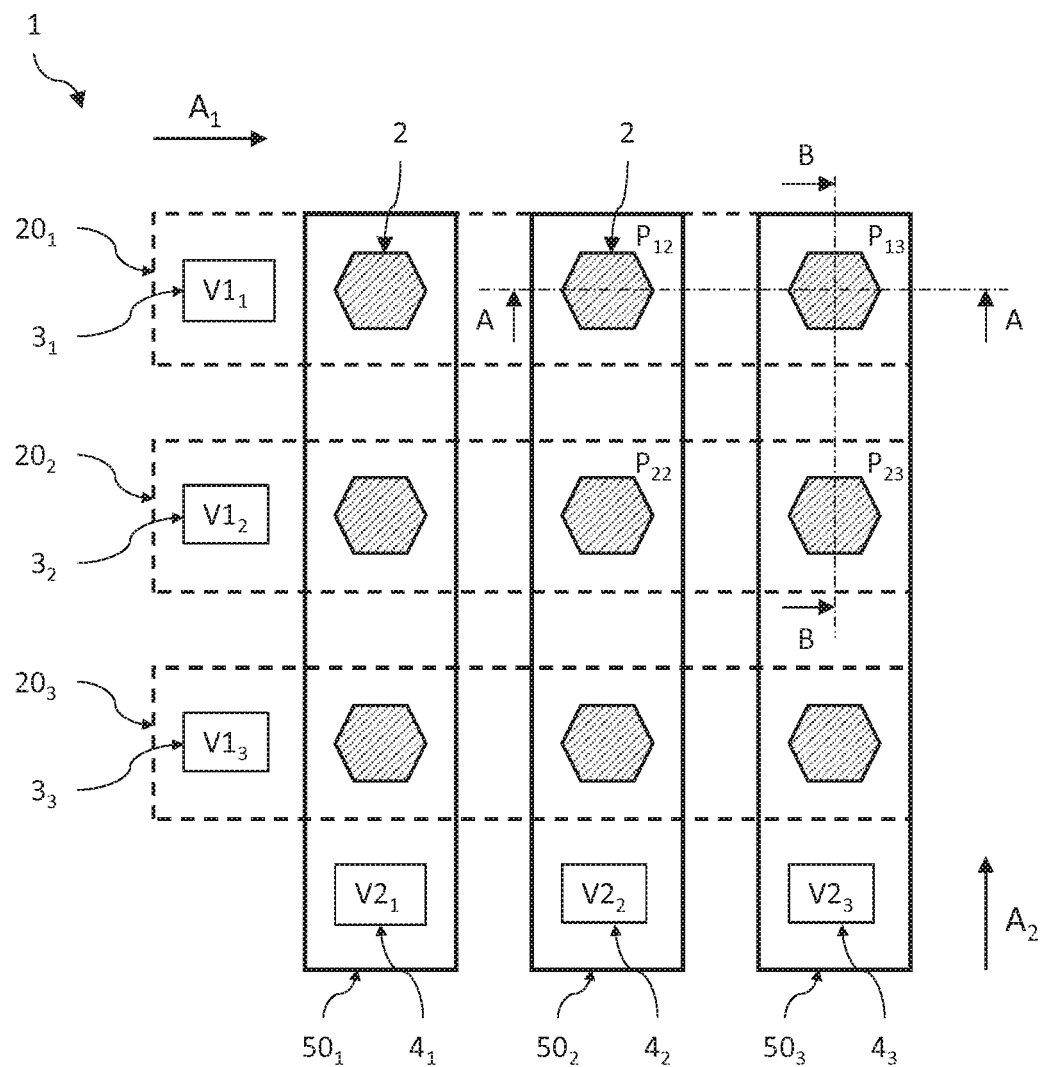
FIG. 2 is a schematic and partial top view of an example of an optoelectronic device according to one embodiment in which the diodes are in contact with conductive nucleation strips and transparent conductive strips forming a matrix of pixels.
Figure 3A:
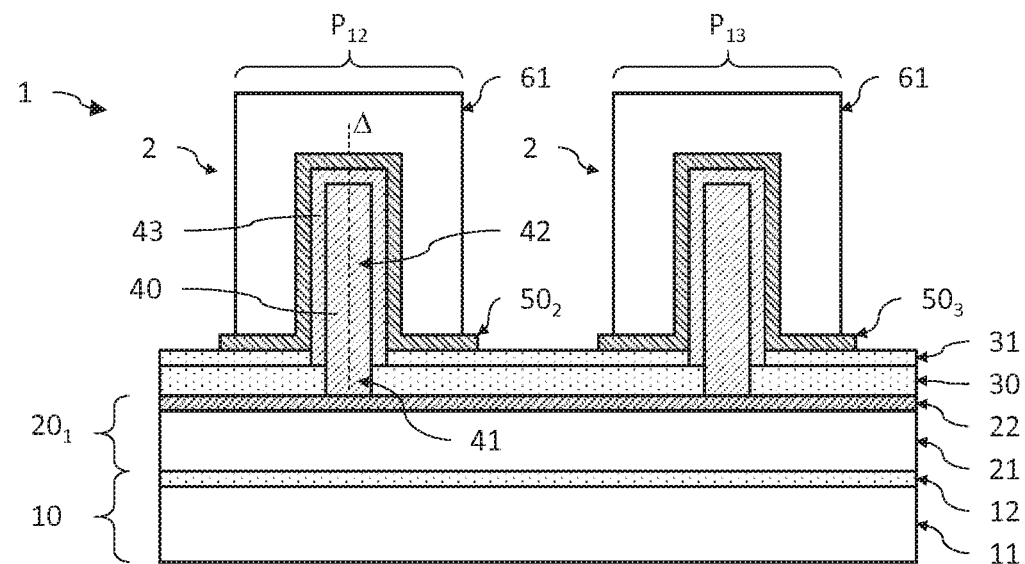
FIGS. 3A and 3B are schematic and partial sectional views, along the sectional planes A-A and B-B, respectively, illustrated in FIG. 2, of an optoelectronic device according to a first embodiment in which the transparent conductive strips extend into the electrical trench isolations.
Figure 3B:
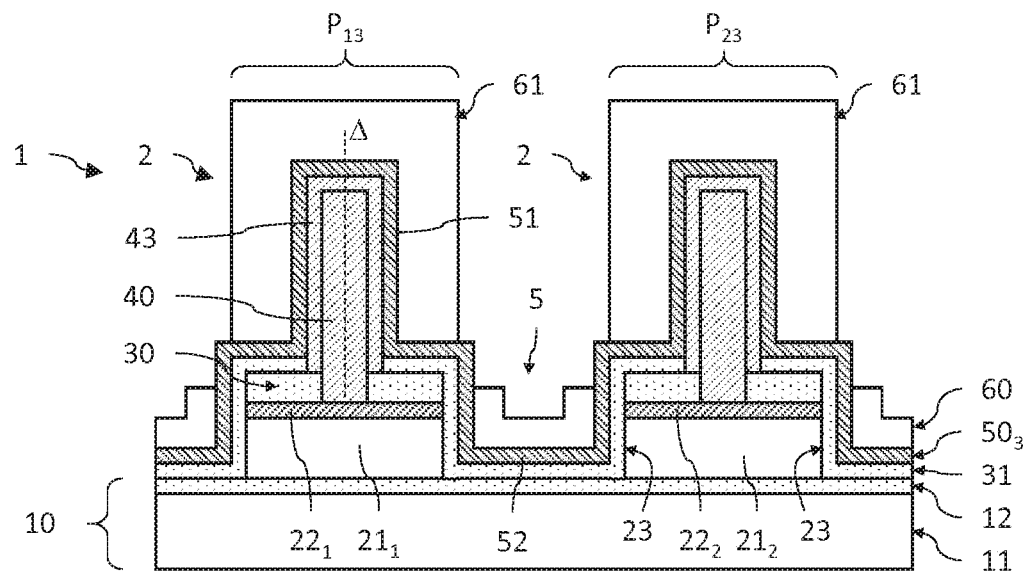

FIG. 2 and FIGS. 3A and 3B illustrate a first embodiment of an optoelectronic device 1 with a matrix of pixels each comprising one or more light-emitting diodes 2. FIG. 2 is a schematic and partial top view, and FIGS. 3A and 3B are schematic and partial sectional views along the plane A-A and B-B, respectively.

Defined here and for the rest of the description is a three-dimensional direct coordinate system XYZ, where the axes X and Y form a plane parallel to the main plane of the substrate, and where the axis Z is oriented in a manner substantially orthogonal to the front face of the substrate. Furthermore, the terms "lower" and "upper" are understood to relate to positions that are nearer to and further from the front face of the substrate in the +Z direction.

In general, the optoelectronic device 1 comprises:
a carrier 10;
a plurality of separate first electrodes 20, extending longitudinally parallel to an axis A1, each first electrode 20 being formed of a stack of a longitudinal conductive portion 21 of low electrical resistance coated with a conductive nucleation strip 22 of higher electrical resistance;
a plurality of three-dimensional diodes 2, each comprising a first three-dimensional doped portion 40 and a second doped portion 43, the first doped portions 40 being in contact with the conductive nucleation strips 22;
at least one intermediate insulating layer 30, 31 covering the first electrodes 20; and
a plurality of second electrodes 50 in the form of separate transparent conductive strips, each extending in contact with different sets of second doped portions 43 of the diodes 2 in parallel with an axis A2 that is not parallel to the axis A1.

The carrier 10 has two faces, called the rear and front faces, opposite one another. The front face is that on which the diodes 2 rest. It may be formed of a stack of layers, for example a semiconductor layer coated with an electrically insulating layer, and may thus be an SOI (for silicon on insulator) substrate in which a thin semiconductor layer coats the insulating layer. It may, as a variant, be a one-piece substrate made of an electrically insulating material, for example sapphire, or of a semiconductor or conductive material. In this example, the carrier 10 is formed of a thick layer 11 coated with a lower insulating layer 12. The upper face of the lower insulating layer 12 defines the electrically insulating front face of the carrier 10. In other words, the substrate comprises an electrically insulating layer, here the lower insulating layer 12, on which the longitudinal conductive portions rest.

The thickness of the thick layer 11 may be between 50 nm and 1500 µm, depending on whether it has been thinned or not. In this example where the carrier 10 has been thinned in order, for example, to allow rear-face electrical contact, or to limit bulk, to increase flexibility, and/or to decrease thermal resistance, it may have a thickness, for example, of between 10 µm and 300 µm, preferably between 10 µm and 100 µm. In the case where it has not been thinned, in particular when contact takes place via the front face, it may have a thickness of between 300 µm and 1500 µm, for example equal to approximately 725 µm.

The lower insulating layer 12 is intended to provide electrical insulation between the longitudinal conductive portions 21 and the thick layer 11 when the latter is electrically conductive. The material of the lower insulating layer 12 may be an oxide of silicon (for example, $SiO_2$) or of aluminum (for example, $Al_2O_3$), a nitride of silicon $SiN_x$ or of aluminum AlN, an oxynitride of silicon $SiO_xN_y$, or any other suitable material. The thickness of the lower insulating layer 12 may be between 5 nm and 50 µm, preferably between 10 nm and 500 nm, for example equal to approximately 30 nm. In this example, the material of the thick layer 11 is monocrystalline silicon and the material of the lower insulating layer 12 is $SiO_2$. As a variant, the lower insulating layer 12 may be formed of a semiconductor material, for example silicon, but having a conductivity type and/or a polarity opposite those of the longitudinal conductive portions 21, so as to provide electrical insulation via reverse-biased p-n junction (depletion).

The optoelectronic device 1 comprises first biasing electrodes 20 allowing the application of an electrical potential $V1_i$ to the first doped portions 40 of the diodes 2. The electrical potential $V1_i$ may vary over time, and may differ from one first electrode 20 to the next. Each first electrode 20 takes the shape of a conductive strip that extends longitudinally over the carrier 10 parallel to an axis A1. They may extend longitudinally in the plane XY in a rectilinear or curved manner, parallel to one another. What is meant by conductive strip here is a stretch of at least one electrically conductive material, for example a semiconductor or metal, deposited as a thin layer, which has a longitudinal dimension in the plane XY (length) greater than the transverse dimension in the plane XY (width) and greater than the thickness dimension along the axis Z. The first electrodes 20 are separate from one another, in the sense that they are physically separated and electrically isolated from one another. Each first electrode 20 is formed of a stack of a longitudinal conductive portion 21, located in contact with the carrier 10, coated on an upper face with a conductive nucleation strip 22.

The longitudinal conductive portions 21 are intended to improve the electrical conduction of the charge carriers between the first connection pads 3 and the first doped portions 40 of the diodes 2, through the conductive nucleation strips 22. For this, they have an electrical resistance lower than that of the conductive nucleation strips 22. In other words, the ratio of the electrical resistivity of the material of the longitudinal conductive portions 21 to the transverse area (product of the thickness and the width) is lower than that of the conductive nucleation strips 22.

They extend longitudinally over the carrier 10, and are each coated, with electrical contact, with a conductive nucleation strip 22. They are moreover electrically connected to first connection pads 3 suitable for applying the electrical potential $V1_i$ to the longitudinal conductive portions 21 and hence to the conductive nucleation strips 22.

They are separate from one another in the sense that they are physically separated and electrically isolated from one another. For this, they are electrically insulated from the thick layer 11 by the lower insulating layer 12 on which they rest, and are insulated laterally by trench isolations 5. Each longitudinal conductive portion 21 forms a rib that extends longitudinally parallel to the axis A1. What is meant by rib is a strip protruding with respect to the plane of the carrier 10.

They are made of an electrically conductive material, preferably a doped semiconductor material. The material has an electrical resistance lower than that of the conductive nucleation strips 22. It may thus be made of an element or a compound from group IV of the periodic table, for example silicon, germanium or silicon carbide, of a III-V compound, for example GaN or GaAs, or of a II-VI compound, for example ZnO. It may also be made of a metal material. Preferably, the material is made of monocrystalline silicon. The semiconductor material is advantageously doped according to the same conductivity type as that of the first doped portions 40 of the diodes 2, so as to decrease its electrical resistivity and thus improve the conduction of the charge carriers. The doping level may be such that the electrical resistivity is lower than or equal to a few mΩ.cm. For example, the doping level of the longitudinal conductive portions 21 made of silicon is preferably higher than $5.10^{16}$ at/cm$^3$, or even higher than $3.10^{17}$ at/cm$^3$, and may be lower than $2.10^{20}$ at/cm$^3$. It may thus be between $3.10^{17}$ at/cm$^3$ and $5.10^{19}$ at/cm$^3$. The dopants, in the case of silicon, may be boron or indium in the case of p-type doping, or phosphorus, arsenic or antimony in the case of n-type doping.

The thickness and width dimensions of the longitudinal conductive portions 21 are preferably uniform along the longitudinal axis and equal from one portion to the next. They are chosen according to the electrical resistivity of the material so that the electrical resistance of the longitudinal conductive portions 21 is lower than that of the conductive nucleation strips 22. The thickness may be between 0.1 µm and 10 µm, preferably between 0.5 µm and 5 µm, for example equal to 1 µm. The width may be between 20 nm and 50 µm, preferably between 0.5 µm and 5 µm, for example equal to approximately 1 µm. The longitudinal conductive portions 21 may be spaced transversely apart from one another by a distance, for example, of between 0.3 µm and 50 µm, for example of about 5 µm to 10 µm.

The conductive nucleation strips 22 each rest on and in contact with the upper face of a longitudinal conductive portion 21. Each conductive nucleation strip 22 has an upper face, opposite the front face of the carrier 10, which forms a nucleation surface with which each first doped portion 40 of the diodes 2 is in contact. The conductive nucleation strips 22 are separate, i.e., physically separated and electrically isolated from one another. Each conductive nucleation strip 22 of index i is in contact with a plurality of first doped portions 40 of diodes 2 arranged longitudinally, the set of diodes 2 being denoted by $D_i$.

The conductive nucleation strips 22 are made of an electrically conductive material suitable for the nucleation and growth of the first doped portions 40. This material may be gallium nitride GaN, or an alloy based on gallium nitride, for example aluminum gallium nitride AlGaN, indium gallium nitride InGaN, or aluminum indium gallium nitride AlInGaN. The conductive nucleation strips 22 are preferably made of a material comprising a transition metal. It may be chosen from titanium, vanadium, chromium, zirconium, niobium, molybdenum, hafnium, tantalum and tungsten, or a nitride or a carbide of a transition metal, for example of titanium, zirconium, hafnium, vanadium, niobium, tantalum, chromium, molybdenum, or a combination of these compounds. The transition metals, along with their nitrides and carbides, have the advantages of allowing the nucleation of the first doped portions 40 and of having an electrical conductivity close to that of the metals. Each conductive nucleation strip 22 may be formed of a single layer portion made of the same material. It may, as a variant, be formed of a stack of several sublayers, including an upper sublayer made of a nucleation material, for example based on an epitaxied transition metal, and of a lower sublayer made of a material of higher electrical resistivity, for example textured crystalline AlN, as described in patent application FR3053054 published 29 Dec. 2017.

The thickness of the conductive nucleation strips 22 is, for example, between 5 nm and 500 nm, preferably between 10 nm and 100 nm, for example equal to approximately 30 nm. They have a width preferably equal to, or even less than, that of the subjacent longitudinal conductive portions 21. The electrical resistance of the conductive nucleation strips 22 is higher than that of the longitudinal conductive portions 21. Thus, the presence of the latter allows the electrical conduction between the first connection pads 3 and the first doped portions 40 of the diodes 2 to be improved. By way of example, and as a first approximation, in the case where the longitudinal conductive portions 21 have a thickness of 1 µm and the conductive nucleation strips 22 a thickness of 20 nm, the electrical resistivity and the width being identical, the electrical resistance of the first electrode 20 is 50 times lower with the longitudinal conductive portions 21 than in the absence of the longitudinal conductive portions 21.

Each first electrode 20 has, in this first embodiment, a conductive structure protruding with respect to the plane of the carrier 10. Each protruding structure is separate from its neighbors, i.e., physically separated and electrically isolated by trench isolations 5. The trench isolations 5 form indentations that extend longitudinally between two adjacent first electrodes 20, along the axis A1. The protruding conductive structures have here an upper face defined by the upper face of the conductive nucleation strips 22 and lateral flanks 23 that extend from the upper face down to the lower insulating layer 12.

The optoelectronic device 1 also comprises a first intermediate insulating layer 30 that covers the conductive nucleation strips 22. It forms a growth mask allowing the epitaxial growth of the first doped portions 40 of the diodes 2 from through-openings 30.1 opening locally onto the nucleation surfaces. It also participates in providing the electrical insulation between the first electrodes 20 and the second electrodes 50, and more precisely between the conductive nucleation strips 22 and the transparent conductive strips 50. The first intermediate insulating layer 30 is made of one or more dielectric materials such as, for example, a silicon oxide (for example, $SiO_2$) or a silicon nitride (for example, $Si_3N_4$ or SiN), or a silicon oxynitride, an aluminum oxide (for example, $Al_2O_3$) or a hafnium oxide (for example, $HfO_2$). The thickness of the intermediate insulating layer may be between 5 nm and 1 µm, preferably between 30 nm and 500 nm, for example equal to approximately 100 nm. In this example, the first intermediate insulating layer 30 extends only over the upper face of the conductive nucleation strips 22. As a variant, it may also extend over the lateral flanks 23 of the first electrodes 20.

Each light-emitting diode 2 has a first doped portion 40, which is three-dimensional in shape. In this embodiment, the first doped portions 40 have an elongate shape along a longitudinal axis Δ, i.e., the longitudinal dimension of which along the longitudinal axis Δ is greater than the transverse dimensions. The first doped portions 40 are then called "wires," "nanowires" or "microwires." The transverse dimensions of the wires, i.e., their dimensions in a plane orthogonal to the longitudinal axis Δ, may be between 10 nm and 10 µm, for example between 100 nm and 10 µm, and preferably between 100 nm and 5 µm. The height of the wires, i.e., their longitudinal dimension along the longitudinal axis Δ, is greater than the transverse dimensions, for example two times (2×), five times (5×) and preferably at least ten times (10×) greater. The cross section of the wires, in a plane orthogonal to the longitudinal axis Δ, may take different shapes, for example a circular, oval, or polygonal shape, for example triangular, square, rectangular or even hexagonal. The diameter is defined here as being a quantity associated with the perimeter of the wire with respect to a cross section. It may be the diameter of a disk having the same area as the cross section of the wire. The local diameter is the diameter of the wire at a given height thereof along the longitudinal axis Δ. The mean diameter is the mean, for example arithmetic mean, of the local diameters along the wire or a portion thereof.

Each first doped portion 40 extends from the nucleation surface of a conductive nucleation strip 22, along a longitudinal axis Δ oriented substantially orthogonal to the plane XY. Each diode 2 also comprises an active region and a second doped portion 43. The wire forms here the core of a light-emitting diode 2 in core/shell configuration, the active region and the second doped portion covering the lateral edge of a part referred to as the upper part of the wire. The wires comprise a lower part 41 that is in contact with the nucleation surfaces and is surrounded by the first intermediate insulating layer 30. This lower part 41 is extended by the upper part 42 that is located outside the growth openings 30.1 and is covered with the active zone and the second doped portion 43.

The wires 40 may be made of a crystalline material epitaxially grown from the nucleation surface. The material of the wires 40 mainly comprises a first semiconductor compound that may be chosen from III-V compounds and, in particular, from III-N compounds, from II-VI compounds or from IV compounds or elements. By way of example, III-V compounds may be compounds such as GaN, InGaN, AlGaN, AlN, InN or AlInGaN, or compounds such as AsGa or InP. II-VI compounds may be CdTe, HgTe, CdHgTe, ZnO, ZnMgO, CdZnO, or CdZnMgO. IV elements or compounds may be Si, C, Ge, SiC, SiGe, or GeC. The wires 40 thus form the first doped portions 40 of the diodes 2, and are doped according to a first conductivity type, here n-type. In this example, the wires 40 are made of n-doped GaN, in particular GaN doped with silicon. Here they have a mean diameter between 10 nm and 10 µm, for example between 500 nm and 5 µm and here substantially equal to 500 nm. The height of the wires 40 may be between 100 nm and 100 µm, for example between 500 nm and 50 µm, and is here substantially equal to 5 µm.

The active region is the portion of diode 2 where most of the light radiation is emitted from diode 2. It may comprise at least one quantum well made of a semiconductor compound having a bandgap energy lower than that of the first doped portion 40 and of the second doped portion 43. Here it covers the upper edge and the lateral edge of the first doped portion 40. It may comprise a single quantum well or a plurality of quantum wells in the form of layers or dots interposed between barrier layers. Alternatively, the active region may not comprise a quantum well. It may have a bandgap energy substantially equal to that of the first doped portion 40 and of the second doped portion 43. It may be made of a semiconductor compound that is not intentionally doped.

The second doped portion 43 forms a layer that covers and at least partially surrounds the active region. It is made of a second semiconductor compound doped according to a second conductivity type opposite the first type, i.e., here p-type. The second semiconductor compound may be identical to the first semiconductor compound of the first doped portion 40 or may comprise the first semiconductor compound and also one or more additional elements. In this example, the second doped portion 43 may be p-doped GaN or InGaN, in particular doped with magnesium. The thickness of the second doped portion 43 may be between 20 nm and 500 nm, and may be equal to approximately 150 nm. Of course, the conductivity types of the first and second doped portions 40, 43 may be reversed. The second doped portion 43 may further comprise an electron blocking interlayer (not shown) located at the interface with the active region. The electron blocking layer may here be formed of a III-N ternary compound, for example AlGaN or AlInN, advantageously p-doped. It increases the rate of radiative recombination in the active region.

The optoelectronic device 1 further comprises a second intermediate insulating layer 31 that covers the first electrodes 20 and participates in providing the electrical insulation between the first electrodes 20 and the second electrodes 50. The second insulating layer covers, in this example, the lateral flanks 23 of the first electrodes 20, i.e., those of the conductive nucleation strips 22 and the longitudinal conductive portions 21. It may also cover the growth mask (first intermediate insulating layer 30), as well as the lower insulating layer 12, as illustrated in FIGS. 3A and 3B. It may come into contact with a lower part of the second doped portions 43. The second intermediate insulating layer 31 may be made of a dielectric material identical to or different from that of the growth mask (first intermediate insulating layer 30), such as, for example, a silicon oxide (for example, $SiO_2$) or a silicon nitride (for example, $Si_3N_4$ or SiN), or a silicon oxynitride, an aluminum oxide (for example, $Al_2O_3$) or a hafnium oxide (for example, $HfO_2$). The thickness of the second intermediate insulating layer 31 may be between 5 nm and 1 µm, preferably between 30 nm and 500 nm, for example equal to approximately 100 nm.

The second biasing electrodes 50 are arranged so as to allow the application of a second electrical potential $V2_j$ to various sets of diodes 2. They may have an electrical potential $V2_j$ that varies over time, the value of which may be differ from one strip to the next.

They take the form of a plurality of transparent conductive strips 50 that are each in contact with a plurality of second doped portions 43 of diodes 2. They are said to be transparent insofar as they are made of a material that is transparent to the light radiation emitted by the light-emitting diodes 2. What is meant by transparent is a material for which the transmission of the light radiation of interest is higher than 50%. They are separate from one another in the sense that they are physically separated and electrically isolated from one another. They are also electrically insulated from the first electrodes 20 by means of at least the second intermediate insulating layer 31.

They may extend longitudinally in the plane XY in a rectilinear or curved manner, parallel to one another and to the axis A2 that is not parallel to the axis A1. In this embodiment, each transparent conductive strip 50 extends longitudinally and comprises parts 51 covering the second doped portions of the diodes 2, these parts 51 being interconnected by what are called connecting parts 52 that extend, in this example, into the trench isolations 5, i.e., over the lateral flanks 23 of the first electrodes 20 and over the bottom of the trench isolations 5.

The pixelization of the diodes 2 is ensured by the fact that the axis A1 and the axis A2 are not parallel, such that one and the same transparent conductive strip 50 is in contact with second doped portions of a set of diodes 2 for which the first doped portions 40 are in contact with different conductive nucleation strips 22. The axes A1 and A2 may be orthogonal. In other words, each conductive nucleation strip 22 of index i is in contact with the first doped portions 40 of a set $D_i$ of a plurality of diodes 2, the second doped portions 43 of which are in contact with various transparent conductive strips 50. Conversely, each transparent conductive strip 50 of index j is in contact with the second doped portions 43 of a set $D_j$ of diodes 2, the first doped portions 40 of which are in contact with various conductive nucleation strips 22. Thus, pixels $P_{ij}$ are defined that correspond to the one or more diodes 2 of which the first doped portions 40 are in contact with the conductive nucleation strip 22 of index i and the second doped portions 43 are in contact with the transparent conductive strips 50 of index j. In other words, the "intersection" of a conductive nucleation strip 22 of index i with a transparent conductive strip 50 of index j forms a pixel $P_{ij}$. In this example illustrated in FIG. 2, each pixel $P_{ij}$ comprises a single diode 2, but it may, as a variant, comprise a plurality of diodes 2. Each pixel $P_{ij}$ may be activated independently of the others.

The transparent conductive strips 50 are made of a material that is electrically conductive and transparent to the light radiation emitted by the diodes 2. It may be, for example, an indium tin oxide (ITO) or a gallium-doped zinc oxide (GZO), or a zinc oxide doped with aluminum or indium. The thickness of the transparent conductive strips 50 is, for example, between 5 nm and 500 nm, preferably between 10 nm and 100 nm, for example equal to approximately 50 nm. Their width is, for example, between 100 nm and 100 µm, preferably between 200 nm and 50 µm, preferably between 800 nm and 30 µm, for example equal to approximately 10 µm. The transparent conductive strips 50 are spaced transversely apart from one another by a distance, for example, between 1 µm and 50 µm, preferably between 1 µm and 20 µm, for example equal to 5 µm.

In this example, a reflective conductive layer 60 is present between the diodes 2 and rests here in the trench isolations 5. The reflective conductive layer 60 may partially or completely fill the volume of the trench isolations 5. It is made of a material suitable for reflecting the incident light radiation emitted by the diodes 2 toward the outside of the optoelectronic device 1. The material may be a metal, for example aluminum, silver, gold, copper, or a combination thereof, or any other suitable material, so as to improve the electrical conduction in the transparent conductive strips 50. The thickness of the reflective conductive layer 60 is, for example, between 10 nm and 2 µm, preferably between 100 nm and 1 µm, for example equal to approximately 500 nm.

Color conversion pads 61 may cover the diodes 2, preferably at the rate of one conversion pad 61 per pixel. Each conversion pad 61 may be formed of a binding matrix comprising particles of a photoluminescent material such as yttrium aluminum garnet (YAG), activated by the cerium ion YAG:Ce. The conversion pads 61 may be adjusted to at least partially convert the excitation light emitted by the diodes 2 into luminescent light of various wavelengths depending on the pads, for example into a green light (approximately 495 nm-560 nm), or into a red light (approximately 600 nm-650 nm). For this, the photoluminescent material is preferably in the form of quantum dots, i.e., in the form of semiconductor nanocrystals of which the average size may be between 0.2 nm and 1000 nm, and preferably between 1 nm and 30 nm. The semiconductor material of the nanocrystals may be chosen, in particular, from cadmium selenide (CdSe), indium phosphide (InP), cadmium sulfide (CdS), zinc sulfide (ZnS), cadmium oxide (CdO), cadmium zinc selenide (CdZnSe), or from other semiconductor materials that may be suitable. The binding matrix may be silica. The thickness of the conversion pads 61 is such that they cover the diodes 2, in particular the top thereof.

As a variant, an encapsulation layer may continuously cover the diodes 2. It is made of a dielectric material that is at least partially transparent to the light radiation emitted by the diodes 2, and may be, for example, an oxide of silicon (for example, $SiO_2$) or of aluminum (for example, $Al_2O_3$), a nitride of silicon $SiN_x$ or of aluminum AlN, silicon oxynitride $SiO_xN_y$, or any other suitable material. The thickness of the encapsulation layer is such that it covers the diodes 2, in particular the top thereof. It is, for example, between 500 nm and 50 µm.

As shown in FIG. 2, the optoelectronic device 1 also comprises a plurality of first connection pads 3 each being electrically connected to a first electrode 20, i.e., to a longitudinal conductive portion 21 and to a conductive nucleation strip 22. The first connection pads 3 may be located on the front face or on the rear face of the carrier 10. In the case of an electrical connection on the rear face of the carrier 10, first through-apertures may extend between the front and rear faces of the carrier 10 and each open onto a longitudinal conductive portion 21. The through-apertures are filled with a conductive material and are in contact with the material of the longitudinal conductive portion 21 on the one hand and with a first connection pad 3 on the other hand. In order to insulate, where applicable, the material from the substrate, the sides of the through-apertures are coated with an insulating layer. The filling material and that of the first connection pads 3 may be made of copper, gold, aluminum or any other suitable conductive material.

As shown in FIG. 2, the optoelectronic device 1 also comprises a plurality of second connection pads 4 each being electrically connected to a second electrode 50, i.e., to a transparent conductive strip 50. The second connection pads 4 may be located on the front or rear face of the carrier 10, in a similar or identical manner to that described for the first connection pads 3.

The optoelectronic device 1 comprises an integrated control circuit (not shown) joined to the carrier 10, and electrically connected to the first electrodes 20 by means of the first connection pads 3, and to the second electrodes 50 by means of the second connection pads 4. The integrated control circuit may comprise electronic components, for example transistors, so as to control the application of a difference in electrical potential, simultaneously or sequentially, to the various pixels $P_{ij}$ of diodes 2.

In operation, when a first electrical potential $V1_i$ is applied to the first electrode 20 (stack of a longitudinal conductive portion 21 and of a conductive nucleation strip 22) of rank i and a second electrical potential is applied to the second electrode 50 (transparent conductive strip) of rank j, the one or more diodes 2 located in the pixel $P_{ij}$ are activated and emit light radiation. The diodes 2 located in the other pixels remain deactivated. Thus, the controlled emission from each pixel, simultaneously or sequentially, is carried out by biasing one or the other of the first electrodes 20 and one or the other of the second electrodes 50.

Thus, the optoelectronic device 1 comprises a plurality of diodes 2 distributed in a matrix of pixels $P_{ij}$ that can be activated independently of one another by means of the first and second biasing electrodes 50 that are in the form of conductive strips that are separate from one another and located on the front face of the carrier 10. In addition, the fact that the first biasing electrodes 20 have an additional nucleation surface function, by way of the conductive nucleation strips 22, makes it possible to simplify the structure and the production process. Furthermore, the fact that the first electrodes 20 are formed of longitudinal conductive portions 21 of lower electrical resistance than the conductive nucleation strips 22 makes it possible to improve the electrical conduction of the charge carriers between the first connection pads 3 and the wire bases. Each pixel may also comprise an expanded area of the active region that is substantially equal to or larger than the area of the pixel in the plane XY, such that the maximum intensity of light emission from the optoelectronic device 1 may be higher than that from the optoelectronic device of the prior art mentioned above. An optoelectronic device 1 with high light intensity and high resolution is thus obtained.

FIGS. 4A to 4F schematically and partially illustrate, in cross section, different steps in an example of a process for producing the optoelectronic device 1 according to the first embodiment described above. Each figure illustrates a sectional view along the plane A-A (left) and a sectional view along the plane B-B (right).

Figure 4A:
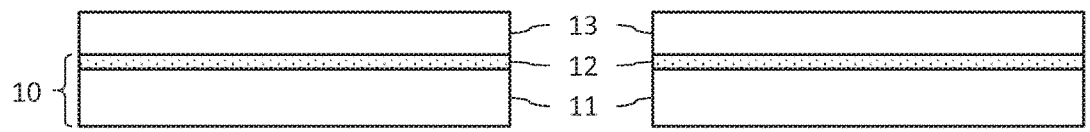
FIGS. 4A to 4F are sectional views, along the sectional planes A-A and B-B, of different steps in a process for producing the optoelectronic device illustrated in FIGS. 3A and 3B.

With reference to FIG. 4A, a stack is provided formed of a carrier 10 and of a layer 13 intended to form the longitudinal conductive portions 21, this layer being here a semiconductor layer 13 doped according to the first conductivity type. The carrier 10 is formed of a thick layer 11 and of a lower insulating layer 12. In this example, this stack is advantageously an SOI substrate. The thick layer 11 is made of silicon, the lower insulating layer 12 of $SiO_x$ and the semiconductor layer 13 of doped monocrystalline silicon, here n-doped. The doping of silicon may be carried out during the production of the SOI substrate or else be carried out by one or more dopant implantations, or be carried out during the epitaxial growth. The doped semiconductor layer 13 has a thickness and a doping level such that the electrical resistance may thus have a thickness of between approximately 0.1 µm and 10 µm, for example equal to 1 µm, and a doping level of between $3.10^{17}$ at/$cm^3$ and $5.10^{19}$ at/$cm^3$.

Figure 4B:
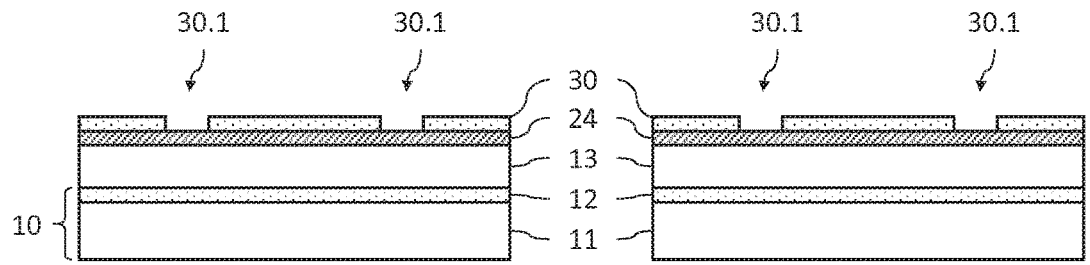

With reference to FIG. 4B, a conductive nucleation layer 24 is deposited, which is intended to subsequently form the conductive nucleation strips 22. The conductive nucleation layer 24 may be deposited by epitaxial growth so as to uniformly cover the upper surface of the doped semiconductor layer 13. It is made of at least one material allowing the subsequent nucleation of the first doped portions 40 of the diodes 2, preferably of a material based on a transition metal, for example using a cathode sputtering technique.

In this example, a first intermediate insulating layer 30 is then deposited, forming a growth mask. However, as a variant, it is possible, beforehand, to structure the conductive nucleation layer 24 by means of photolithography and etching in order to form the various conductive nucleation strips 22. A first intermediate insulating layer 30 of a dielectric material, for example SiO or SiN, is thus deposited so as to cover the upper surface of the conductive nucleation layer 24, then through-openings 30.1 are formed so as to open locally onto nucleation surfaces. Preferably, the lateral dimensions of the through-openings 30.1 are smaller than the width of what will be the conductive nucleation strips 22, for example at least twice as small. As a variant, it is possible to produce the longitudinal conductive portions 21 and the conductive nucleation strips 22 by means of photolithography and etching, before the step of depositing the first intermediate insulating layer 30.

Figure 4C:
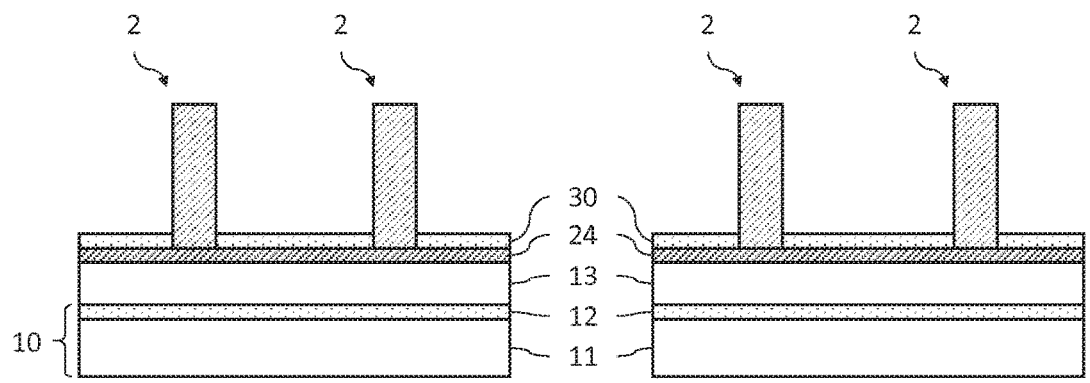

With reference to FIG. 4C, the first doped portions 40, here made of GaN, are formed by epitaxial growth from the nucleation surfaces of the various conductive nucleation strips 22, through the openings 30.1 in the growth mask (first intermediate insulating layer 30). In this example, the diodes 2 are produced before the formation of the trench isolations 5 but, as a variant, they could be produced after the formation of these trench isolations.

The epitaxy technique may be a chemical vapor deposition (CVD) type process, for example with organometallic precursors (MOCVD, for metal-organic chemical vapor deposition) or by means of a molecular-beam epitaxy (MBE) type process, a hydride vapor phase epitaxy (HVPE) type process, an atomic layer epitaxy (ALE) type process or an atomic layer deposition (ALD) type process, or by means of evaporation or cathode sputtering. Preferably, the epitaxy process is identical or similar to that described in document WO2012/136665. First doped portions 40 are thus obtained in the form of wires that extend along the longitudinal axis Δ from the nucleation surfaces. The first semiconductor compound of the first doped portions 40, namely here GaN, is n-doped with silicon. The lower part 41 of the wires (first doped portion 40) is located in the openings 30.1 of the first intermediate insulating layer 30, and is extended along the longitudinal axis Δ by the upper part 42. The active regions formed by alternating barrier layers and quantum wells here made of InGaN cover the upper part 42 of the wires, and are covered by the second doped portion 43, namely here made of p-doped GaN or InGaN. The second doped portions 43 and the active regions thus form the shells of the diodes 2 in the core/shell configuration.

Figure 4D:
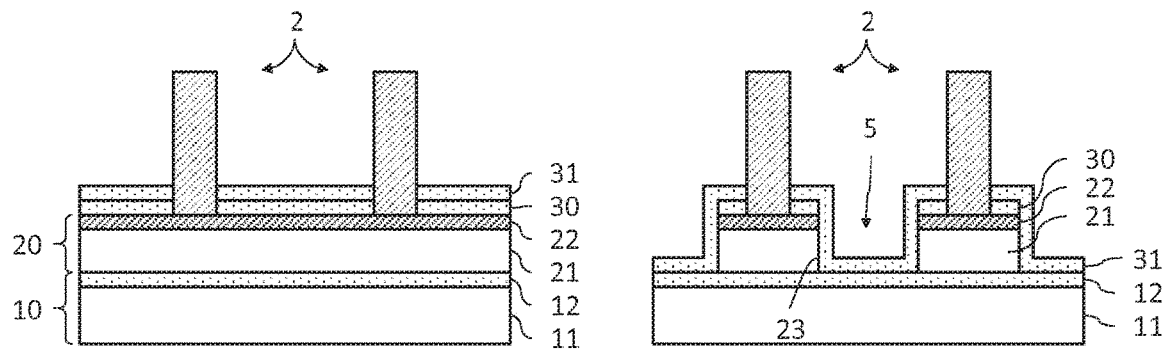

With reference to FIG. 4D, the trench isolations 5 are produced so as to form the first electrodes 20. For this, localized longitudinal etches are carried out on the stack formed of the growth mask (first intermediate insulating layer 30), of the conductive nucleation layer 24 and of the doped semiconductor layer 13 until reaching the upper face of the lower insulating layer 12. This step is carried out using conventional photolithography and etching operations. A plurality of first electrodes 20 are thus obtained that are separate from one another and electrically isolated from the neighbors by the trench isolations 5. The first electrodes 20 extend longitudinally along the axis A1. In this example, the longitudinal conductive portions 21 and the conductive nucleation strips 22 have the same width, which remains constant longitudinally.

Then, a second intermediate insulating layer 31 is deposited that is intended to participate in electrically insulating the first electrodes 20 from the second electrodes 50. For this, it is possible to proceed as described in patent application WO2016/108023, i.e., by depositing an insulating layer conformally over the entire structure obtained previously, then by covering it with a layer of photoresist, by partially etching the layer of resist to at least partially expose the insulating layer covering the second doped portion 43, and by etching this exposed part of the insulating layer. In the case that the trench isolations 5 are not filled, the second intermediate insulating layer 31 covers the lateral flanks 23 of the first electrodes 20 and extends here down to the lower insulating layer 12. It may or may not cover the lower insulating layer 12.

Figure 4E:
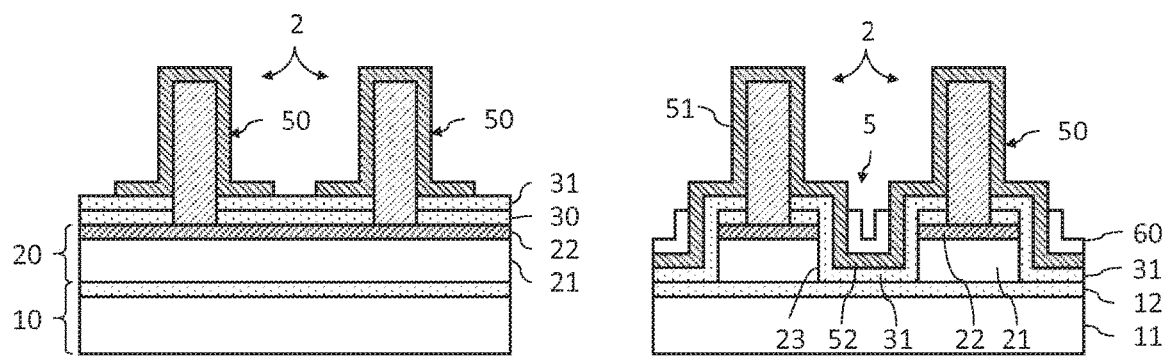

With reference to FIG. 4E, the second electrodes 50, i.e., the transparent conductive strips 50, are formed. To do this, a continuous layer of a conductive material is deposited conformally, which is here at least partially transparent to the light radiation emitted by the diodes 2. Then, by means of photolithography and etching, the transparent conductive strips 50 that are separate from one another are formed, extending parallel to an axis A2. Here, they each comprise parts that cover the second doped portions 43 of a set Dj of diodes 2, these covering parts 51 being connected longitudinally pairwise by connecting parts 52 that extend into the trench isolations 5, thus covering the lateral sides 23 of the first electrodes 20 and the lower insulating layer 12. The second electrodes 50 are electrically insulated from the first electrodes 20 by means of the first and second intermediate insulating layers 30, 31.

Advantageously, the connecting parts 52 of the transparent conductive strips 50 are covered with a reflective conductive layer 60 suitable for decreasing the electrical resistance of the transparent conductive strips 50 and for reflecting the incident radiation emitted by the diodes 2. This reflective conductive layer 60 may be made of one or more materials chosen from aluminum, silver, gold or any other suitable material, and has a thickness, for example between 20 nm and 1500 nm, preferably between 400 nm and 800 nm. The thickness may be chosen so as to fill the free volume of the trench isolations 5. For this, a continuous conductive and reflective layer is deposited in a conformal manner. Then, by means of photolithography and etching, the reflective conductive strips 60, which are separate from one another, are formed, extending parallel to an axis A2.

Figure 4F:
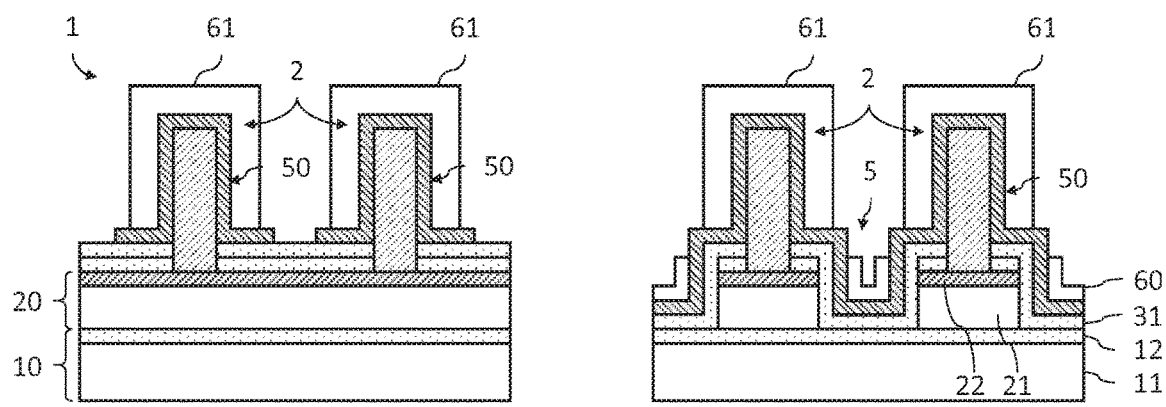

With reference to FIG. 4F, the color conversion pads 61 are produced, preferably at the rate of one pad per pixel. The production of the conversion pads 61 may be carried out using conventional techniques known as additive techniques (for example, inkjet) or using what are known as subtractive techniques (deposition of a colloidal dispersion or of a photoresist comprising color conversion elements and then formation of the pads by means of photolithography or laser ablation).

Next, the first connection pads 3 and the second connection pads 4 (not shown) are produced. In the case where these pads 3, 4 are produced on the rear face of the carrier 10, the thick layer 11 may be thinned, then through-apertures are made that open onto the first electrodes 20 and onto the second electrodes 50. The flanks of the through-apertures may be coated with an insulating layer, then a conductive material fills the interior of the through-apertures. The first and second connection pads 4 are then formed.

The process for producing the optoelectronic device 1 has the advantage of forming pixels $P_{ij}$ of diodes 2 by means of the first and second electrodes 20, 50 positioned on the front face of the carrier 10, which are in the form of conductive strips that are separate from one another. Thus, the carrier 10 has improved mechanical strength, which, in particular, facilitates hybridization with the control circuit. In addition, the diodes 2 have preserved optical and/or electronic properties insofar as the pixelization of the diodes 2 does not require, as in the example of the prior art mentioned above, etching of the doped portions and of the active region. The electrical properties of the optoelectronic device 1 are improved by the formation of the first electrodes 20 in the form of a stack of a longitudinal conductive portion 21 with low electrical resistance and of a conductive nucleation strip 22.

Figure 5A:
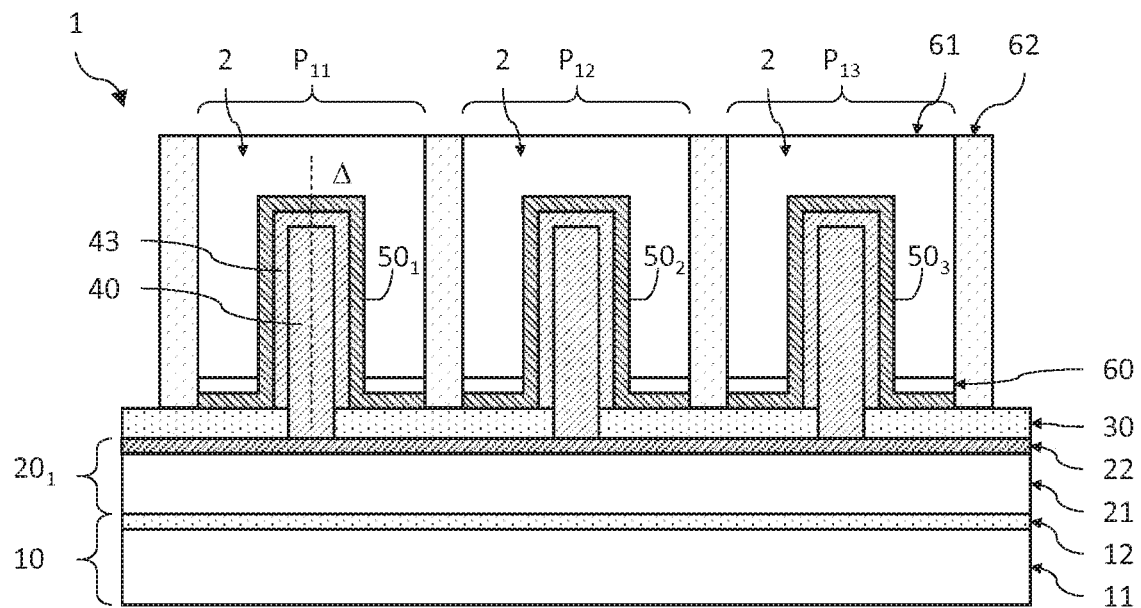
FIGS. 5A and 5B are schematic and partial sectional views, along the sectional planes A-A and B-B, respectively, illustrated in FIG. 2, of an optoelectronic device according to a second embodiment in which the electrical trench isolations are filled so as to form a continuous planar surface.
Figure 5B:
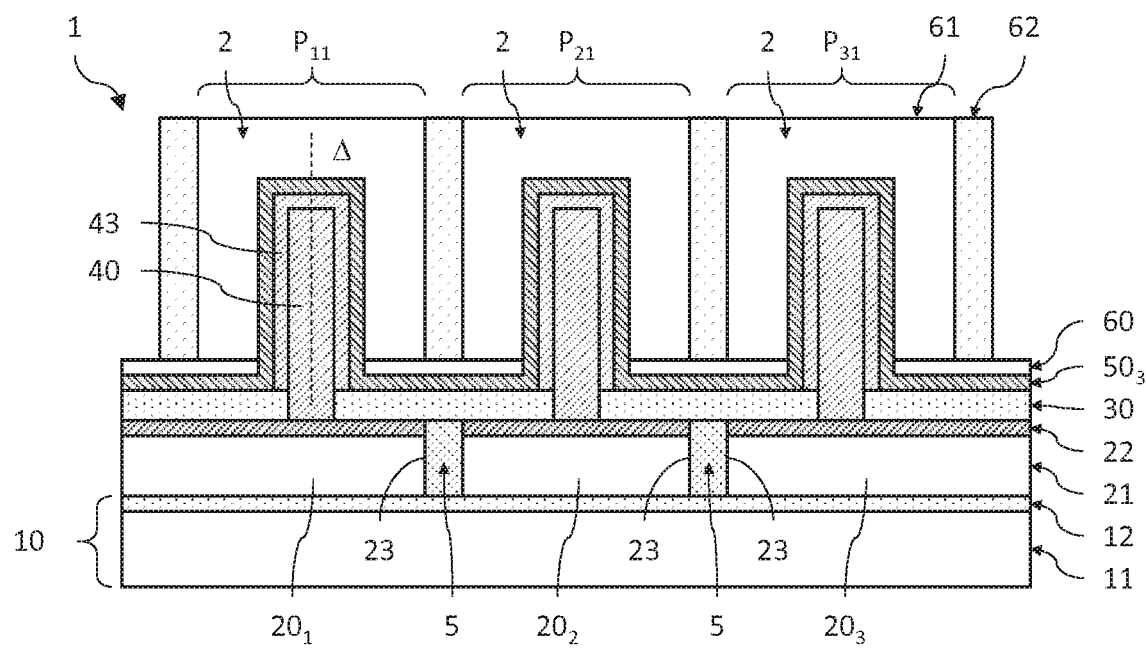

FIGS. 5A and 5B are schematic and partial views, in section along the plane A-A and B-B, respectively, of an optoelectronic device 1 according to a second embodiment.

The optoelectronic device 1 according to the second embodiment differs from that illustrated in FIGS. 3A and 3B, in particular, in that the trench isolations 5 are filled with a dielectric material, so as to form a planar surface together with the upper face of the conductive nucleation strips 22. Thus, the first intermediate insulating layer 30 (growth mask) extends continuously in a planar manner.

The first electrodes 20 are electrically isolated from the neighbors by trench isolations 5, for example of the STI (for shallow trench isolation) type, which extend along the lateral flanks 23 of the first electrodes 20 down to the lower insulating layer 12.

The growth mask (first intermediate insulating layer 30) is coated locally with the transparent conductive strips 50. It thus provides the electrical insulation between the first and second electrodes 20, 50. The second intermediate insulating layer 31 is not necessary, insofar as the transparent conductive strips 50 do not descend into the trench isolations 5.

This embodiment makes it possible to obtain trench isolations 5 of smaller width, and thus making it possible to increase the resolution of the optoelectronic device 1. By way of example, the trench isolations 5 may have a width of between 0.15 μm and 10 μm, for example equal to 1 μm. The width of the trench isolations 5 corresponds to the distance separating the facing lateral flanks 23 of the adjacent first electrodes 20.

FIGS. 6A to 6F schematically and partially illustrate, in cross section, different steps in an example of a process for producing the optoelectronic device 1 according to the second embodiment described above.

Figure 6A:
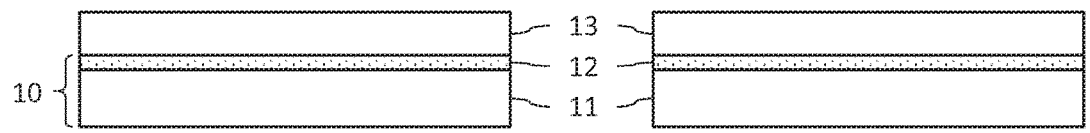
FIGS. 6A to 6F are sectional views, along the sectional planes A-A and B-B, of different steps in a process for producing the optoelectronic device illustrated in FIGS. 5A and 5B.

The step in FIG. 6A is identical to that described above with reference to FIG. 4A.

Figure 6B:
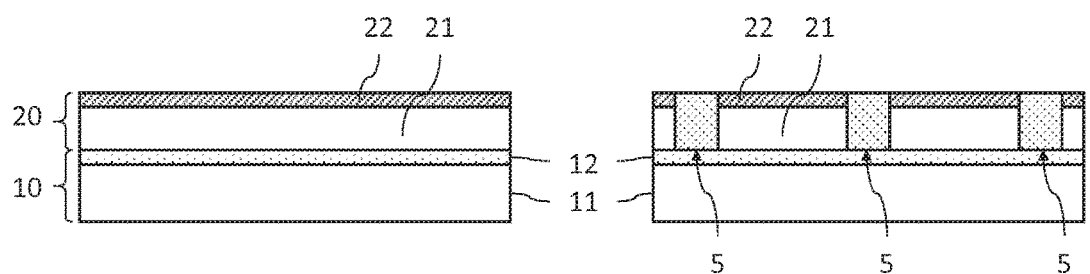

With reference to FIG. 6B, a conductive nucleation layer 24 is deposited, in a similar or identical manner to the deposition described above (FIG. 4B), and STI-type trench isolations 5 are produced. For this, a longitudinal localized etch of the conductive nucleation layer 24 and of the doped semiconductor layer 13 is carried out, then the trench isolations 5 are filled with a dielectric material, for example a silicon oxide. Planarization by chemical-mechanical polishing (CMP) is then carried out. A planar surface formed of the upper face of the conductive nucleation strips 22 and of the upper face of the dielectric filling material is thus obtained. As a variant, it is possible first to produce the trench isolations 5 in the doped semiconductor layer 13, then to carry out the structured deposition of the conductive nucleation layer 24 in order to obtain the conductive nucleation strips 22.

Figure 6C:
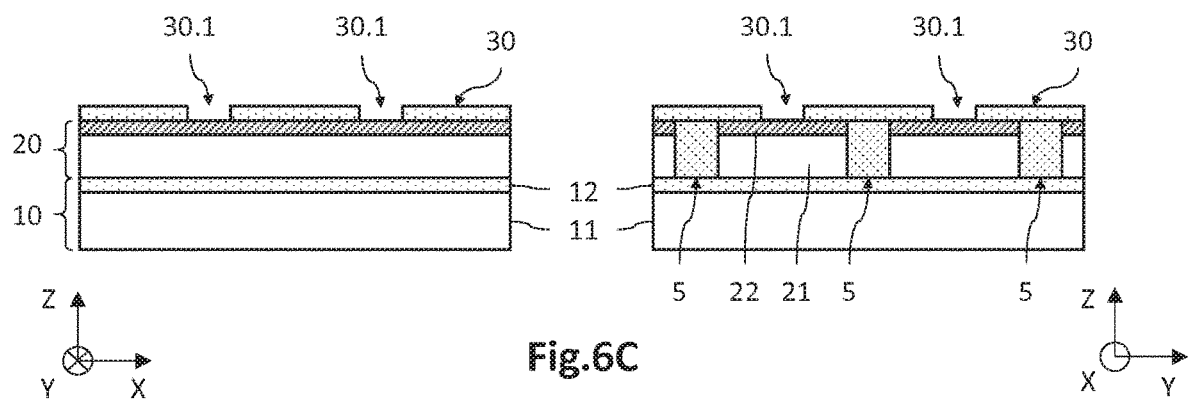

With reference to FIG. 6C, the growth mask (first intermediate insulating layer 30) is produced. For this, the intermediate insulating layer is deposited on the planar surface, then the through-openings 30.1 opening onto the nucleation surfaces are formed. The first intermediate insulating layer 30 thus extends planarly in the plane XY and does not extend into the trench isolations 5.

Figure 6D:
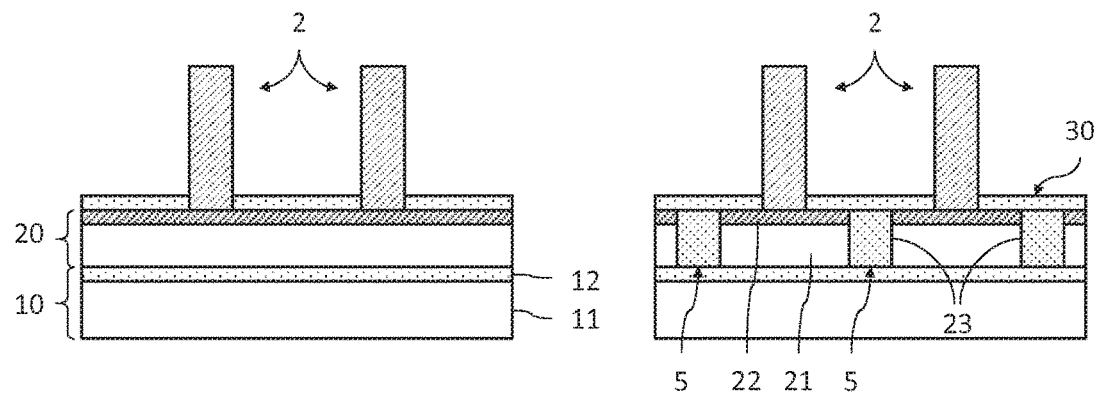

With reference to FIG. 6D, the diodes 2 are produced. This step is identical to that described previously with reference to FIG. 4D.

Figure 6E:
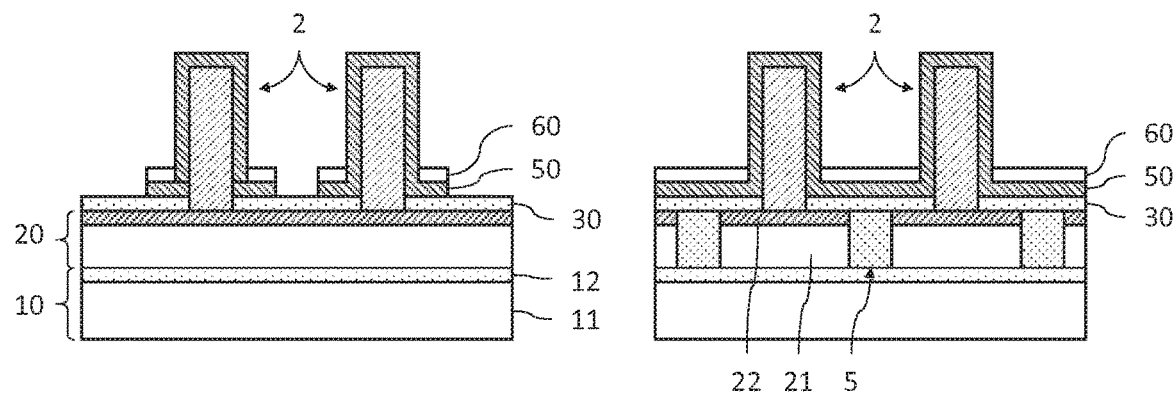

With reference to FIG. 6E, the second electrodes 50 are produced in the form of transparent conductive strips. For this, a transparent conductive layer is deposited that is structured by photolithography and etching to form the strips 50. The connecting parts 52 extend here planarly over the growth mask (first intermediate insulating layer 30) and do not descend into the trench isolations 5. A reflective conductive layer 60 is then formed on the connecting parts 52 of the transparent conductive strips 50 in order to improve the electrical conduction and allow the optical reflection of the incident light radiation.

Figure 6F:
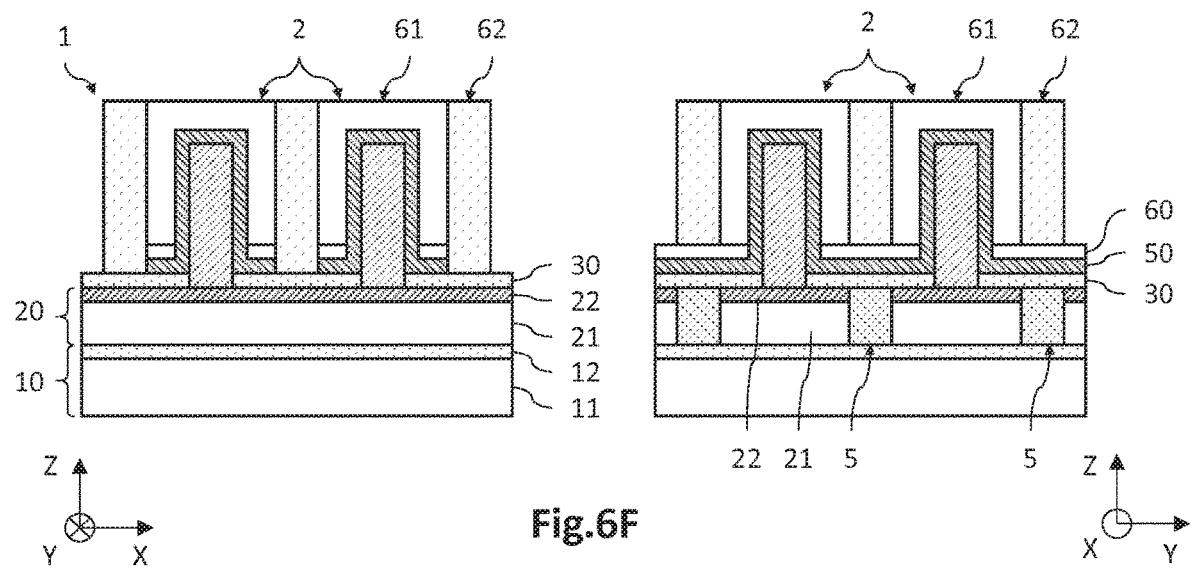

With reference to FIG. 6F, the color conversion pads 61 are produced. In this example, an encapsulation layer 62 extends between the conversion pads 61.

It is advantageous for the STI-type trench isolations 5 to be produced before the diodes 2 are formed, so as to obtain a particularly small pixel spacing pitch and therefore a high-resolution optoelectronic device.

Figure 7A:
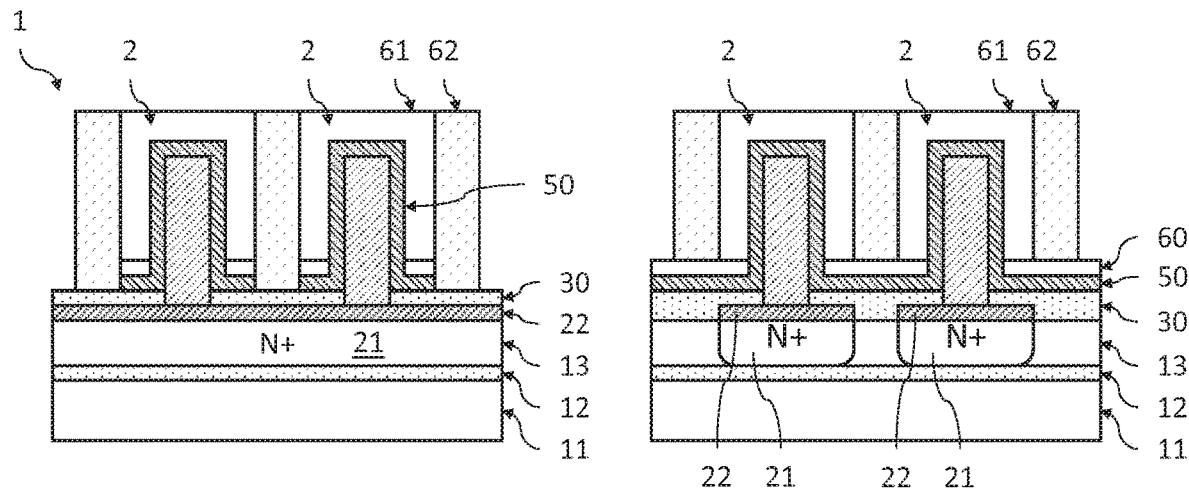
FIG. 7A illustrates schematic and partial sectional views, along the sectional planes A-A and B-B, respectively, illustrated in FIG. 2, of an optoelectronic device according to a third embodiment in which the longitudinal conductive portions are formed by localized doping of the carrier.
Figure 7B:
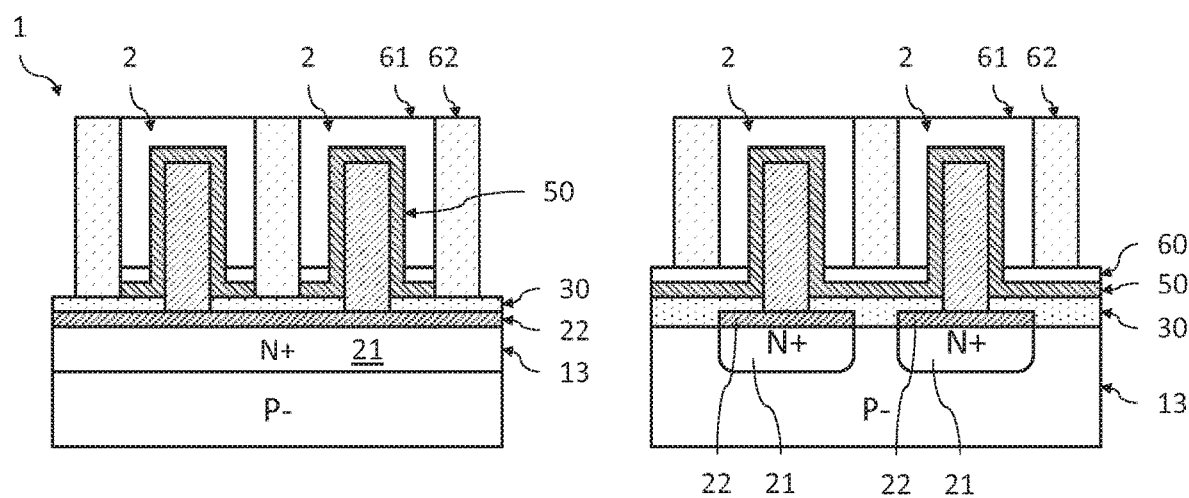
FIG. 7B illustrates schematic and partial sectional views, along the sectional planes A-A and B-B, respectively, of an optoelectronic device according to one variant of the third embodiment.

FIGS. 7A and 7B are schematic and partial views, in section along the plane A-A and B-B, of two variants of an optoelectronic device 1 according to a third embodiment.

The optoelectronic device 1 according to the third embodiment differs from those illustrated in FIGS. 3A and 3B and FIGS. 5A and 5B primarily in that the longitudinal conductive portions 21 are formed inside a semiconductor layer 13 of the carrier 10 from an upper face thereof, and are electrically insulated from one another via reverse-biased p-n junctions (depletion). In other words, each longitudinal conductive portion 21 is formed of a longitudinal well, i.e., of a region doped according to the first conductivity type (identical to that of the first doped portions 40 of the diodes 2) of the semiconductor layer 13 doped according to the second conductivity type.

By way of example, with reference to FIG. 7A, the carrier 10 is formed here of a stack of a thick layer 11, of a lower insulating layer 12 and of a semiconductor layer 13. This semiconductor layer 13 may be lightly doped and has a p-type conductivity, and the longitudinal conductive portions 21 are formed by heavily n-doped wells. Each well extends from the upper surface of the semiconductor layer 13 on which the conductive nucleation strips 22 rest, here down to the lower insulating layer 12. The thick layer 11 is electrically insulated from the wells by the lower insulating layer 12 and may be n- or p-doped, or even be intrinsic (not intentionally doped).

With reference to FIG. 7B, the carrier 10 does not have a thick layer 11 or a lower insulating layer 12 and is formed of just the semiconductor layer 13. As above, the semiconductor layer 13 is here lightly p-doped, and the longitudinal conductive portions 21 are formed by heavily n-doped wells. Each well (longitudinal conductive portion 21) extends from the upper surface of the semiconductor layer 13 on which the conductive nucleation strips 22 rest.

The wells that form the longitudinal conductive portions 21 may be obtained by ion implantation before the production of the conductive nucleation strips 22. As in the second embodiment, the growth mask (first intermediate insulating layer 30) extends planarly over the semiconductor layer 13 comprising the longitudinal conductive portions 21, and over the conductive nucleation strips 22. It provides the electrical insulation between the first and second electrodes 20, 50.

Some particular embodiments have just been described. Different variants and modifications will be apparent to a person skilled in the art, in particular in terms of the conductivity type of the wells forming the longitudinal conductive portions 21 and of the semiconductor layer, as well as in terms of doping level.

Furthermore, features of one embodiment may be present in other embodiments. Thus, with reference to FIG. 3B, pads of an electrically insulating material, for example a silicon oxide or nitride, may be in contact with the lateral flanks 23 of the first electrodes 20, thus improving the electrical insulation between the first and second electrodes 20, 50.

The light-emitting diodes described above are in what is called the core/shell configuration. They may, as a variant, have an axial configuration in which the second doped portion 43 covers only the axial end of the first doped portion 40, between which the active region is located. The second intermediate insulating layer 31 (FIG. 3B) or the first intermediate insulating layer (FIGS. 5A and 5B; FIGS. 7A and 7B) then has a thickness such that the transparent conductive strips 50 cover only the second doped portions 43 without laterally coating the first doped portions 40.

The invention claimed is:

1. An optoelectronic device comprising:
a carrier;
a plurality a plurality of separate first electrodes that extend longitudinally in contact with the carrier, parallel to an axis A1, each first electrode of the plurality of separate first electrodes being formed of a stack of a longitudinal conductive portion located in contact with the carrier and coated with a conductive nucleation strip of a plurality of conductive nucleation strips, the longitudinal conductive portion having an electrical resistance lower than an electrical resistance of the conductive nucleation strip of the plurality of conductive nucleation strips;
a plurality of diodes, each diode of the plurality of diodes comprising:
a first three-dimensional portion doped according to a first conductivity type; and
a second portion doped according to a second conductivity type opposite the first conductivity type,
the first three-dimensional portion, of the each diode of the plurality of diodes, being in contact with the plurality of conductive nucleation strips,
the plurality of diodes being arranged such that each conductive nucleation strip, of the plurality of conductive nucleation strips, is in contact with a plurality of the first three-dimensional portions arranged longitudinally;
at least one intermediate insulating layer covering the first electrodes of the plurality of separate first electrodes; and
a plurality of plurality of separate second electrodes in a form of transparent conductive strips that extend longitudinally in contact with the second portions of the plurality of diodes,
the plurality of separate second electrodes being electrically insulated from the plurality of separate first electrodes by the at least one intermediate insulating layer, parallel to an axis A2, the axis A2 not being parallel to the axis A1, such that one of the transparent conductive strips is in contact with a plurality of the second portions of the plurality of diodes,
the first three-dimensional portions, of the plurality of diodes, being in contact with different conductive nucleation strips of the plurality of conductive nucleation strips.

2. The optoelectronic device as claimed in claim 1, wherein the longitudinal conductive portions have a predetermined thickness and are made of a semiconductor material doped according to the first conductivity type, a doping level and the thickness being adjusted such that an electrical resistivity to thickness ratio of the longitudinal conductive portions is lower than an electrical resistivity to thickness ratio of the conductive nucleation strips of the plurality of conductive nucleation strips.

3. The optoelectronic device as claimed in claim 1, wherein the first electrodes, of the plurality of separate first electrodes, are isolated transversely from one another by trench isolations.

4. The optoelectronic device as claimed in claim 3, wherein each first electrode, of the plurality of separate first electrodes, rests on a lower insulating layer and has lateral flanks that extend down to the lower insulating layer, the at least one intermediate insulating layer extending so as to cover the plurality of conductive nucleation strips and the lateral flanks.

5. The optoelectronic device as claimed in claim 4, wherein wherein:
the transparent conductive strips extend so as to cover the plurality of conductive nucleation strips, the lateral flanks, and the lower insulating layer, and
the transparent conductive strips are electrically insulated from the lateral flanks by the at least one intermediate insulating layer.

6. The optoelectronic device as claimed in claim 3, wherein each trench isolation is filled with an insulating material forming, together with the plurality of conductive nucleation strips, a planar surface.

7. The optoelectronic device as claimed in claim 6, wherein the trench isolations have a width of between 0.15 µm and 10 µm.

8. The optoelectronic device as claimed in claim 1, wherein the carrier comprises a semiconductor layer doped according to the second conductivity type, the longitudinal conductive portions, of the plurality of separate first electrodes, being formed in the semiconductor layer in the form of longitudinal wells separate from one another and doped according to the first conductivity type.

9. The optoelectronic device as claimed in claim 6, wherein the at least one intermediate insulating layer extends planarly and covers the plurality of separate first electrodes while being in contact with the plurality of conductive nucleation strips.

10. The optoelectronic device as claimed in claim 1, wherein each transparent conductive strip, of the transparent conductive strips of the plurality of separate second electrodes, comprises:
parts covering a set of the second portions of the plurality of diodes; and
additional parts resting on the at least one intermediate insulating layer,
the parts being connected to one another by the additional parts.

11. The optoelectronic device as claimed in claim 10, wherein the additional parts are covered by and in contact with a reflective conductive layer.

12. The optoelectronic device as claimed in claim 1, wherein the conductive nucleation strips, of the plurality of conductive nucleation strips, comprises a transition metal.

* * * * *

UNITED STATES PATENT AND TRADEMARK OFFICE
CERTIFICATE OF CORRECTION

PATENT NO. : 11,362,137 B2
APPLICATION NO. : 16/958628
DATED : June 14, 2022
INVENTOR(S) : Vincent Beix and Erwan Dornel Page 1 of 1

It is certified that error appears in the above-identified patent and that said Letters Patent is hereby corrected as shown below:

In the Claims

| | | | |
|---|---|---|---|
| Claim 1, | Column 17, | Line 18, | change "a plurality a plurality of" to --a plurality of-- |
| Claim 1, | Column 17, | Line 46, | change "a plurality a plurality of" to --a plurality of-- |
| Claim 5, | Column 18, | Line 20, | change "wherein wherein:" to --wherein:-- |

Signed and Sealed this
Eleventh Day of July, 2023

Katherine Kelly Vidal
*Director of the United States Patent and Trademark Office*